United States Patent
Liebermann et al.

(10) Patent No.: US 8,054,911 B2
(45) Date of Patent: Nov. 8, 2011

(54) METHOD FOR EDGE FORMATION OF SIGNALS AND TRANSMITTER/RECEIVER COMPONENT FOR A BUS SYSTEM

(75) Inventors: Fred Liebermann, Radebeul (DE); Axel Pannwitz, Radebeul (DE)

(73) Assignee: Atmel Corporation, San Jose, CA (US)

( * ) Notice: Subject to any disclaimer, the term of this patent is extended or adjusted under 35 U.S.C. 154(b) by 805 days.

(21) Appl. No.: 11/950,361

(22) Filed: Dec. 4, 2007

(65) Prior Publication Data
US 2008/0205498 A1    Aug. 28, 2008

Related U.S. Application Data

(60) Provisional application No. 60/873,032, filed on Dec. 6, 2006.

(30) Foreign Application Priority Data

Dec. 4, 2006   (DE) .......................... 10 2006 058 889

(51) Int. Cl.
*H04K 1/02*   (2006.01)
*H04L 25/03*  (2006.01)
*H04L 25/49*  (2006.01)

(52) U.S. Cl. ......................................... 375/296; 327/47
(58) Field of Classification Search .................. 375/296; 327/47
See application file for complete search history.

(56) References Cited

U.S. PATENT DOCUMENTS

| | | | |
|---|---|---|---|
| 5,347,537 A * | 9/1994 | Mori et al. .................... | 375/142 |
| 5,400,027 A | 3/1995 | Moyal | |
| 6,194,913 B1 | 2/2001 | Verkinderen | |
| 2003/0094907 A1 * | 5/2003 | Nerone et al. .................. | 315/224 |
| 2006/0091930 A1 * | 5/2006 | Chen et al. ..................... | 327/355 |
| 2006/0179372 A1 * | 8/2006 | Volk .............................. | 714/724 |
| 2007/0007993 A1 * | 1/2007 | Kao ............................... | 326/30 |

(Continued)

FOREIGN PATENT DOCUMENTS

JP   7050585   2/1995

(Continued)

OTHER PUBLICATIONS

Office Action for Korean Patent Application 1020097014009, Jan. 18, 2011.

(Continued)

*Primary Examiner* — David C. Payne
*Assistant Examiner* — Tanmay Shah
(74) *Attorney, Agent, or Firm* — Baker Botts L.L.P.

(57) ABSTRACT

A method is provided for edge formation of signals and transmitter/receiver component for a bus system. A transmitter/receiver component for a bus system comprises a driver transistor, which is to be looped between a bus line of the bus system and a reference potential and is used to output signals on the bus line, a control unit for the driver transistor, a high-frequency interference detector, which is configured in such a way that it detects a high-frequency interference level on the bus line of the bus system, whereby the control unit is configured in such a way that it controls the driver transistor, depending on the detected high-frequency interference level, in such a way that an edge steepness of the output signals increases when the high-frequency interference level on the bus line increases, and an edge steepness of the output signals decreases when the high-frequency interference level on the bus line decreases.

17 Claims, 3 Drawing Sheets

U.S. PATENT DOCUMENTS

2008/0276023 A1 * 11/2008 Wenzel .................. 710/110

FOREIGN PATENT DOCUMENTS

| JP | 10209845 | 8/1998 |
|----|----------|--------|
| JP | 11251897 | 9/1999 |
| JP | 2002-043898 | 2/2000 |
| JP | 2002-295090 | 10/2000 |
| JP | 2004-534423 | 11/2004 |
| WO | WO 2002/073912 A2 | 9/2002 |

OTHER PUBLICATIONS

*Japanese Patent Office Communication*, Japanese OA and English Translation for Appl. No. 2009-539647, Ref No. 080900.0620; File No. X1Q-1192, Jul. 2011.

* cited by examiner

METHOD FOR EDGE FORMATION OF SIGNALS AND TRANSMITTER/RECEIVER COMPONENT FOR A BUS SYSTEM

This nonprovisional application claims priority to German Patent Application No. DE 102006058889, which was filed in Germany on Dec. 4, 2006, and to U.S. Provisional Application No. 60/873,032, which was filed on Dec. 6, 2006, and which are both herein incorporated by reference.

BACKGROUND OF THE INVENTION

1. Field of the Invention

The present invention relates to a method for edge formation of signals and a transmitter/receiver component for a bus system.

2. Description of the Background Art

In unshielded bus systems to reduce high-frequency interference radiation, edges of signals to be transmitted are formed by means of transmitter/receiver components used for signal transmission. The transmitter/receiver components are also called transceivers or bus drivers. When the edge steepness of the signal output to the bus decreases, the interference radiation caused by the signals also decreases accordingly.

With a low edge steepness, however, the sensitivity to coupled-in high-frequency interference signals rises. The reason for this, on the one hand, is that in the case of a slow signal edge in the presence of high-frequency interferences, a signal receiver can switch repeatedly between different logic levels, because the signal thresholds assigned to the logic levels are repeatedly exceeded or underrun with a slow rise or fall. Another reason is the interference sensitivity of the edge form circuits of the transmitter/receiver components.

SUMMARY OF THE INVENTION

It is therefore an object of the present invention to provide a method for edge formation of signals, output to a bus line of a bus system, and a transmitter/receiver component for a bus system, said method that assures a high bus system interference immunity.

The method for edge formation of signals, output to a bus line of a bus system, comprises the steps: detection of a high-frequency (HF) interference level on the bus line of the bus system, increasing the edge steepness of the output signals when the high-frequency interference level on the bus line increases, and reducing the edge steepness of the output signals when the high-frequency interference level on the bus line decreases. In the presence of HF interference levels or HF interferences, the edge steepness increases according to the invention, as a result of which multiple switching in a receiver of the signals or the signal edge is prevented or reduced, because the duration of the signal edge decreases.

In a development of the method, the edge steepness is increased continuously with an increasing HF interference level on the bus line. To this end, for example, a control current for a gate terminal of a driver transistor, which is used to output the signals on the bus line, is increased continuously with an increasing HF interference level, as a result of which said transistor can be switched more rapidly or greatly between a turned-on state and a blocked state. Alternatively, the edge steepness is increased stepwise from a first edge steepness value to at least one second edge steepness value, when the HF interference level exceeds at least one first high-frequency interference level threshold.

In a development of the method, to detect the HF interference level, frequencies of interference signals within a frequency range of from 500 kHz to 5 GHz, preferably 900 kHz to 3 GHz, especially preferably 1 MHz to 1 GHz, are taken into account.

In a development of the method, the detection of the HF interference level comprises a rectification of the high-frequency interference signals present on the bus line. Preferably, the detection of the HF interference level comprises furthermore a filtering of the rectified high-frequency interference signals, particularly a formation of an average from the rectified high-frequency interference signals. The HF interference level can be reliably detected in this manner.

In a development of the method, in the case of an increase in the edge steepness of the signals, a rising signal edge and/or falling signal edge is delayed by such a time period that for a receiver of the signals, the rising signal edge and/or falling signal edge can be received at an unchanged point in time. In other words, the time period is set in such a way that a receiver does not note the change in edge steepness. When with an increase in edge steepness the signal is not delayed, a change in level is detected earlier in a receiver, and as a result, a timing specification of the bus system is perhaps violated. This is effectively prevented by the delay of the signal edges. In the case of a decreasing edge steepness, because of the decreasing HF interference level, the delay time period is again reduced accordingly. Here, for example, with an increase in the edge steepness of the signals, a rising signal edge and/or falling signal edge is delayed by a time period, so that the signal edge with the increased edge steepness reaches a threshold value, assigned to a logic level, at a same time as the signal edge of a signal with a normal edge steepness.

In a development of the method, the bus system is a Local Interconnect Network (LIN) bus system. With respect to the properties and specification of this system, reference is made to the relevant standards and the relevant literature.

The transmitter/receiver component of the invention for a bus system comprises a driver transistor, which is to be looped between a bus line of the bus system and a reference potential and is used to output signals on the bus line, a control unit for the driver transistor, and a high-frequency interference detector. The high-frequency interference detector is configured in such a way that it detects a high-frequency interference level on the bus line of the bus system. The control unit is configured in such a way that it controls the driver transistor, depending on the detected high-frequency interference level, in such a way that an edge steepness of the output signals increases when the high-frequency interference level on the bus line increases, and an edge steepness of the output signals decreases when the high-frequency interference level on the bus line decreases.

In a development of the transmitter/receiver component, a first controllable current source, which is looped between a supply voltage and a gate terminal of the driver transistor, and a second controllable current source are provided, which is looped between the gate terminal of the driver transistor and a reference potential. The controllable current sources are used for the defined charging or discharging of the gate electrode of the driver transistor, as a result of which, for example, it is possible to achieve the desired edge form in an operating mode without HF interferences. The first and second controllable current source can be part of the control unit and/or be configured as separate from the control unit and only controlled by said unit. A filter, particularly a lowpass filter, for interference suppression is looped preferably between the gate terminal of the driver transistor and the first controllable current source and the second controllable current source. The filter prevents interferences on the bus line from influencing the function of the controllable current sources, because these are suppressed by the filter.

In a development of the transmitter/receiver component, said component comprises a third controllable current source, which is looped between a supply voltage and a gate terminal of the driver transistor, and a fourth controllable current source, which is looped between the gate terminal of the driver transistor and a reference potential; in this case, the third controllable current source and the fourth controllable current source are controlled by the control unit to change the edge steepness of the output signals. Here, for example, the first and second controllable current source can implement an operating mode without HF interferences; in this case, parallel to the first and second current source, the third and the fourth current source provide for an increase in edge steepness if HF interferences are detected.

In a development of the transmitter/receiver component, said component comprises a delay unit that is configured in such a way that in the case of an increase in the edge steepness of the signals, a rising signal edge and/or falling signal edge is delayed by such a time period that for a receiver of the signals the rising signal edge and/or falling signal edge can be received at an unchanged point in time. Preferably, the delay unit is configured in such a way that with an increase in edge steepness, a rising signal edge and/or falling signal edge is delayed by a time period, so that the signal edge with the increased edge steepness reaches a threshold value, assigned to a logic level, at a same time as the signal edge of a signal with a normal edge steepness.

In a development of the transmitter/receiver component, the high-frequency interference detector comprises a rectifier that rectifies high-frequency interference signals present on the bus line. Preferably, the high-frequency interference detector comprises a filter that filters the rectified high-frequency interference signals. Preferably, the filter comprises an averager that forms an average from the rectified high-frequency interference signals.

The bus system is preferably an LIN bus system, the transmitter/receiver component forming a LIN bus driver or a LIN transceiver.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
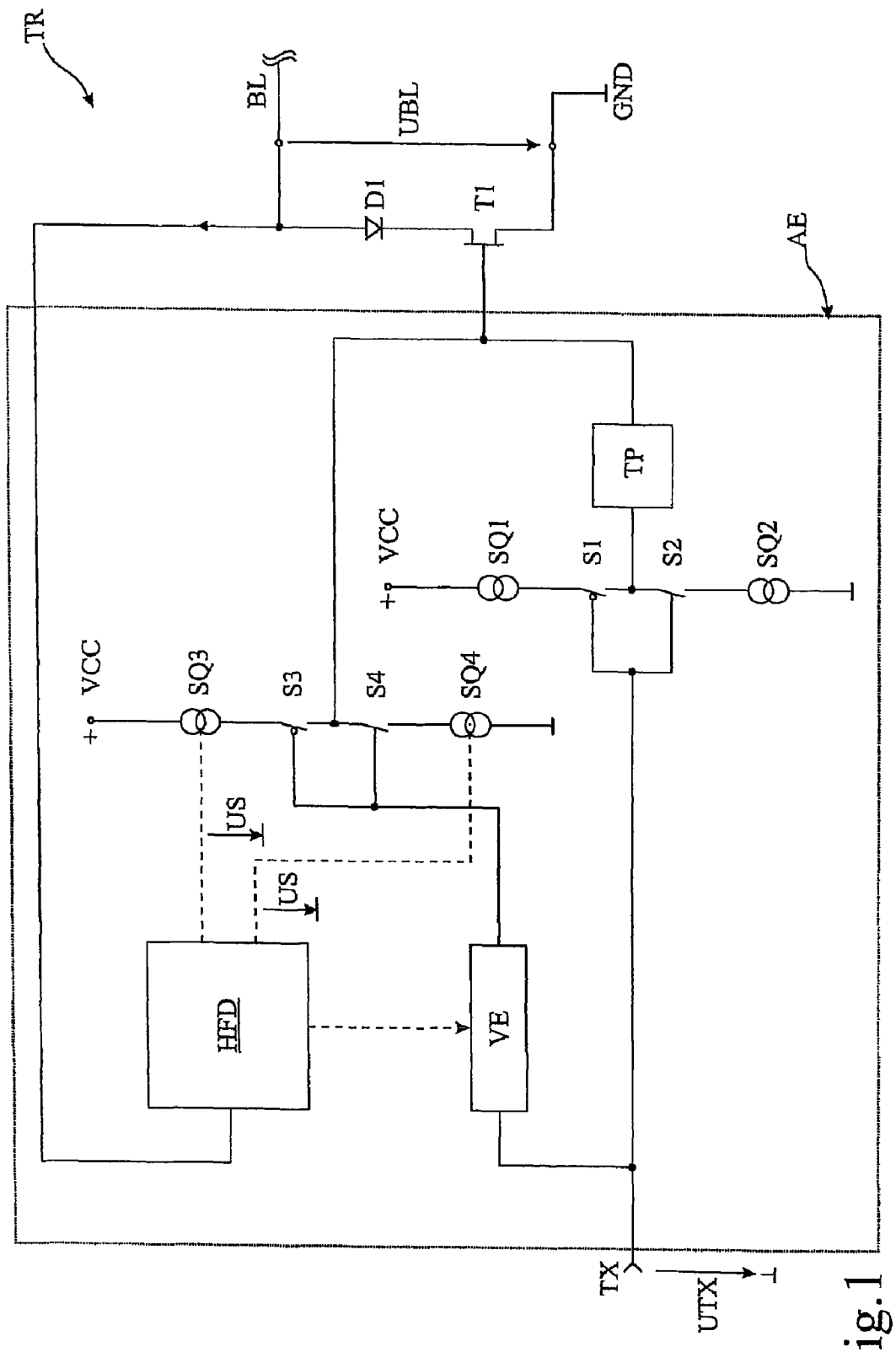
FIG. 1 is a circuit diagram of a transmitter/receiver component for a LIN bus system.

FIG. 1 shows a circuit diagram of a transmitter/receiver component TR for a LIN bus system. The transmitter/receiver component TR comprises a MOS driver transistor T1, which is looped in a conventional manner in series with an inverse-polarity protection diode D1 between a bus line BL of the bus system and a reference potential GND and which is used to output signals on the bus line BL. Apart from the shown elements D1 and T1, still further elements, which are not shown, may be present if they are necessary. Reference is made here also to the LIN bus specification and to the relevant literature.

In the shown transmitter/receiver component TR, for reasons of clarity, only the transmit path of the invention is shown. The receive path can be implemented in a conventional way.

The transmitter/receiver component TR comprises an input terminal TX to which, for example, a port of a microcontroller (not shown) is connected. The signals applied at input terminal TX are output through the transmitter/receiver component TR to the LIN bus.

A control unit AE is used to control driver transistor T1. Control unit AE is configured in such a way that it controls driver transistor T1, depending on a detected high-frequency interference level on bus line BL, in such a way that an edge steepness of the signals generated by driver transistor T1 increases when the high-frequency interference level on bus line BL increases, and an edge steepness of the generated signals decreases when the high-frequency interference level on bus line BL decreases.

Control unit AE to this end comprises a high-frequency interference detector HFD, which is configured in such a way that it detects a high-frequency interference level on bus line BL of the bus system. High-frequency interference detector HFD is depicted in the exemplary embodiment shown in FIG. 1 as part of control unit AE, but it can also be disposed separate from said unit.

Control unit AE comprises furthermore a first controllable current source SQ1, a first switching means S1, and a lowpass filter TP, which are looped in series between a supply voltage VCC and a gate terminal of driver transistor T1. A second controllable current source SQ2, a switching means S2, and lowpass filter TP are looped in series between the gate terminal of driver transistor T1 and a reference potential GND. Lowpass filter TP is used to suppress high-frequency interferences on bus line BL, which are coupled in via transistor T1, particularly via its gate-drain capacitor and its gate-source capacitor. Lowpass filter TP therefore protects the shown circuit arrangement, particularly elements SQ1/S1 and SQ2/S2, from HF interferences on bus line BL.

Switching means S1 and S2 are used to separate current sources SQ1 or SQ2 from the gate terminal of transistor T1 during a charging process or during a discharging process of the gate terminal of transistor T1. Switching means S1 and S2 are opened or closed alternately depending on a signal UTX applied at input terminal TX; i.e., in the case of a charging process, switching means S1 is closed and switching means S2 is opened and in the case of a discharging process, switching means S1 is opened and switching means S2 is closed, as a result of which the charge is transferred to the gate terminal of transistor T1 or the charge is removed from the gate terminal. Current sources SQ1 and SQ2 during a switching process of the signal from a low level to a high level or from a high level to a low level provide a charge or a discharge current for the gate terminal of transistor T1 in such a way that a desired edge form of the signal output to the bus line BL results which causes only minimal interference radiation. The edge steepness of the signals generated or output in this way is relatively low in this case.

To increase the edge steepness of the signals in the case of significant high-frequency interference levels, a third controllable current source SQ3 and a switching means S3 are provided, which are looped in series between supply voltage VCC and the gate terminal of driver transistor T1. Accordingly, a switching means S4 and a fourth controllable current source SQ4 are provided, which are looped between the gate terminal of driver transistor T1 and the reference potential GND. The third controllable current source SQ3 and the fourth controllable current source SQ4 are controlled by the high-frequency interference detector HFD of control unit AE to change the edge steepness of the output signal by means of a signal US; i.e., a current strength of a charge or discharge current, supplied by current source SQ3 or SQ4, is increased or reduced depending on the HF interference level detected by high-frequency interference detector HFD according to control signal US.

Switching means S3 and S4 are used analogously to switching means S1 and S2 to separate current sources SQ3 or SQ4 from the gate terminal of transistor T1 during a charging or discharging process. Switching means S3 and S4 are opened or closed depending on the signal UTX applied at input terminal TX, whereby switching means S3 and S4 in relation to switching means S1 and S2 are controlled in a delayed way, because a delay unit VE is looped between input terminal TX and switching means S3 and S4.

Delay unit VE is used in the case of an increase in the edge steepness of signals to delay a rising signal edge and falling signal edge by such time periods tv1 or tv2 (see FIG. 2) that for a receiver of the signals the rising signal edge and falling signal edge can be received at an unchanged point in time. In other words, time periods tv1 and tv2 generated by delay unit VE are set in such a way that a receiver does not note the change in edge steepness. When with an increase in edge steepness the signal is not delayed, a change in level is detected earlier in a receiver, as a result of which a timing specification of the system is perhaps violated. This is effectively prevented by the delay of the signal edges.

In the shown exemplary embodiment, delay time period tv1 of the rising edge differs from delay time period tv2 of the falling edge. Delay time periods tv1 and tv2 can be set optionally dynamically depending on the HF interference level; i.e., in the case of a decreasing edge steepness due to a decreasing HF interference level, delay time periods tv1 and tv2 are accordingly reduced and in the case of an increasing edge steepness due to an increasing HF interference level, the delay time periods tv1 and tv2 are accordingly increased. Delay time periods tv1 and tv2 are preferably constant.

When a significant HF interference level on bus line BL is detected by high-frequency interference detector HFD, the detector controls current sources SQ3 and SQ4 in such a way that these supply a specific current that is clearly higher than the current supplied by current sources SQ1 and SQ2. This has the result that after the elapse of delay time period tv1 or tv2, generated by delay unit VE, when either switching means S3 or S4 is closed, the gate terminal of transistor T1 is charged or discharged much more rapidly, as a result of which the edge steepness of the output signal increases appreciably. The current supplied by current sources SQ3 and SQ4 can be increased continuously with an increasing HF interference level or stepwise from a first edge steepness value to at least one second edge steepness value, when the high-frequency interference level exceeds at least one first high-frequency interference level threshold.

The increased edge steepness has the result that interferences on bus line BL during the signal edge do not lead to an uncontrolled switching in a receiver.

The control parts SQ1/S1 and SQ2/S2 and SQ3/S3 and SQ4/S4 shown in FIG. 1 are used to clarify the control principle. It is understood that other elements, which are not shown but are known to the person skilled in the art, may be present.

Figure 2:
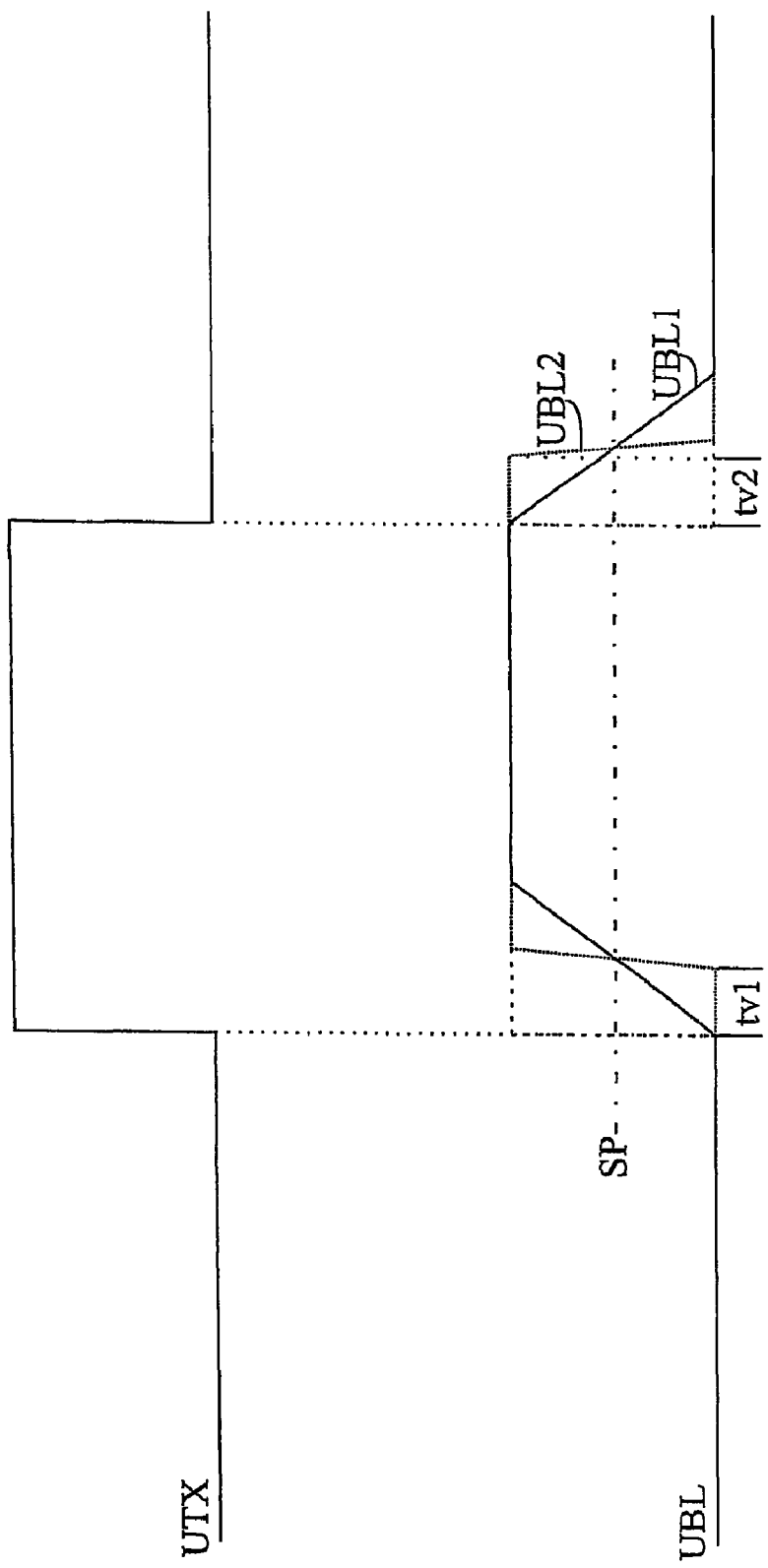
FIG. 2 shows curves of the signals generated by the transmitter/receiver component of FIG. 1.

FIG. 2 shows signal curves for a voltage UBL on bus line BL, which is generated by transmitter/receiver component TR depending on a voltage UTX applied at input TX. If HF detector HFD detects no HF interferences on bus line BL, a signal curve UBL1 results, which has a small edge steepness. Signal curve UBL1 results in a minor interference radiation on bus line BL.

If, however, the high-frequency interference detector HFD detects significant HF interferences on bus line BL, it controls current sources SQ3 and SQ4 in such a way that these provide an appreciably increased charge or discharge current. The signal UBL2 resulting in this case has an appreciably increased edge steepness, as a result of which the susceptibility to interference declines considerably.

Delay unit VE delays the closing of switch S3 or S4 based on the rising or falling edge of input signal UTX by time period tv1 or tv2, so that a receiver (not shown) does not note the change in edge steepness. Delay time period tv1 or tv2 is set by delay unit VE in such a way that a threshold value or switching level SP is achieved simultaneously by signal UBL1 and signal UBL2. Switching level SP is assigned to a logic level; i.e., when signal UBL1 or UBL2 exceeds switching level SP, a first logic value is detected in the receiver, and when signal UBL1 or UBL2 underruns switching level SP, a second logic value is detected in the receiver. Different switching levels or threshold values can also be established for rising and falling edges.

Figure 3:
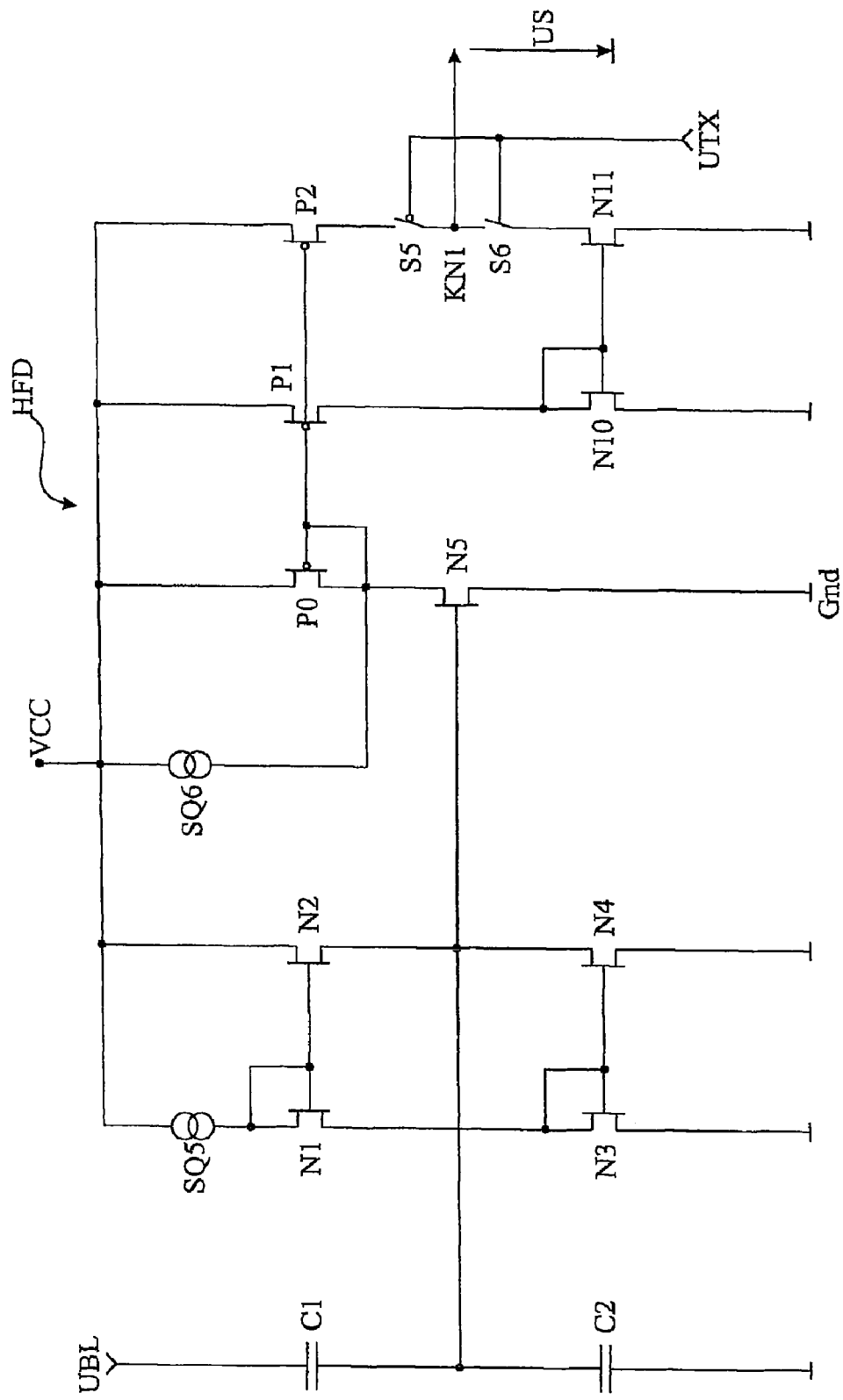
FIG. 3 is a circuit diagram of a high-frequency interference detector of the transmitter/receiver component of FIG. 1.

FIG. 3 shows a circuit diagram of the high-frequency interference detector HFD of the transmitter/receiver component TR of FIG. 1.

The high-frequency interference detector HFD comprises capacitors C1 and C2, which are looped between bus line BL and reference potential GND and form a capacitive voltage divider. A current source SQ5, an NMOS transistor N1, and an NMOS transistor N3 are looped in series between supply voltage VCC and reference potential GND. An NMOS transistor N2 and an NMOS transistor N4 are looped in series between supply voltage VCC and reference potential GND. The drain terminal and gate terminal of transistor N1 are connected to one another. The gate terminals of transistors N1 and N2 are connected to one another. The drain terminal and gate terminal of transistor N3 are connected to one another. The gate terminals of transistors N3 and N4 are connected to one another.

A PMOS transistor P0 and an NMOS transistor N5 are looped between supply voltage VCC and reference potential GND. The gate terminal and source terminal of transistor P0 are connected to one another. A current source SQ6 is connected parallel to the drain-source path of transistor P0. A connection node of the first capacitor C1 and second capacitor C2 is connected to a connection node of transistor N2 and of transistor N4 and a gate terminal of transistor N5.

A PMOS transistor P1 and an NMOS transistor N10 are looped in series between supply voltage VCC and reference potential GND. The gate terminals of transistors P0 and P1 are connected to one another. The drain terminal and gate terminal of transistor N10 are connected to one another.

A PMOS transistor P2, a switching means S5, a switching means S6, and an NMOS transistor N11 are looped in series between supply voltage VCC and reference potential GND.

The control signal US for controllable current sources SQ3 and SQ4 is applied at a connection node KN1 of switching means S5 and S6.

Switching means S5 and S6 are controlled by control voltage UTX, whereby switching means S5 is either closed and switching means S6 is open or switching means S5 is open and switching means S6 closed.

Transistors N1 to N5 form a so-called "translinear loop." Assuming that transistors N1 to N5 are all identical, the drain current of transistor N5 corresponds to the current of current source SQ5. If current sources SQ5 and SQ6 are the same, no current flows into the input of the current bank, formed by transistors P0 to P2.

HF interferences on bus line BL are conducted via the capacitive voltage divider from capacitors C1 and C2 to the gate of transistor N5. In a negative direction, the source electrode of transistor N2 clamps the voltage. In a positive direction, transistor N2 is high-impedance. The gate potential of transistor N5 increases due to this rectification effect. The drain current of transistor N5 is now much greater than the current of current source SQ6 and the resulting differential current flows into input transistor P0 of the PMOS current bank.

Transistor P2 makes available the charge current for the gate terminal of driver transistor T1, and transistor P1 and the current mirror formed from transistors N10 and N11 generate the specific discharge current.

The shown circuit arrangement of high-frequency interference detector HFD acts initially as a peak value rectifier, which rectifies the high-frequency interference signals present on the bus line. The rectified signals are then filtered, for example, with a lowpass filter and/or an averager. During the detection of the signal US, the filter takes into account frequencies of interference signals in a frequency range from 1 MHz to 1 GHz.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for edge formation of signals that are output to a bus line of a bus system, the method comprising:
   detecting a high-frequency interference level on the bus line of the bus system;
   increasing an edge steepness of the output signals when the high-frequency interference level on the bus line increases; and
   reducing the edge steepness of the output signals when the high-frequency interference level on the bus line decreases;
   wherein with an increase in the edge steepness of the signals, one or more of a rising signal edge and a falling signal edge is delayed by a time period, so that the signal edge of a signal with the increased edge steepness reaches a threshold value, assigned to a logic level, at a same time as the signal edge of a signal with a normal edge steepness.

2. The method according to claim 1, wherein the edge steepness is increased continuously with an increasing high-frequency interference level on the bus line.

3. The method according to claim 1, wherein the edge steepness is increased stepwise from a first edge steepness value to at least one second edge steepness value, when the high-frequency interference level exceeds at least one first high-frequency interference level threshold.

4. The method according to claim 1, wherein, to detect the high-frequency interference level, frequencies of interference signals within a frequency range of from 500 kHz to 5 GHz, 900 kHz to 3 GHz, or 1 MHz to 1 GHz, are taken into account.

5. The method according to claim 1, wherein the detection of the high-frequency interference level further comprises the step of rectifying the interference signals present on the bus line.

6. The method according to claim 5, wherein the detection of the high-frequency interference level further comprises the step of filtering the rectified high-frequency interference signals, particularly the formation of an average from the rectified high frequency interference signals.

7. The method according to claim 1, wherein, in the case of the increase in the edge steepness of the signals, the one or more of the rising signal edge and the falling signal edge is delayed by such a time period that for a receiver of the signals, the one or more of the rising signal edge and the falling signal edge can be received at an unchanged point in time.

8. The method according to claim 1, wherein the bus system is a LIN bus system.

9. A transmitter/receiver component for a bus system comprising:
   a driver transistor that is looped between a bus line of the bus system and a reference potential and is used to output signals on the bus line;
   a control unit for the driver transistor;
   a high-frequency interference detector configured to detect a high-frequency interference level on the bus line of the bus system; and
   a delay unit, which is configured in such a way that with an increase in an edge steepness of the signals, one or more of a rising signal edge and a falling signal edge is delayed by a time period so that the signal edge of a signal with the increased edge steepness reaches a threshold value, assigned to a logic level, at an identical time as the signal edge of a signal with a normal edge steepness;
   wherein the control unit is configured to control the driver transistor depending on the detected high-frequency interference level so that an edge steepness of the output signals increases when the high-frequency interference level on the bus line increases, and so that the edge steepness of the output signals decreases when the high-frequency interference level on the bus line decreases.

10. The transmitter/receiver component according to claim 9, further comprising:
    a first controllable current source that is looped between a supply voltage and a gate terminal of the driver transistor; and
    a second controllable current source that is looped between the gate terminal of driver transistor and a reference potential.

11. The transmitter/receiver component according to claim 10, wherein a filter or a lowpass filter for interference suppression is looped between the gate terminal of the driver transistor and the first controllable current source and the second controllable current source.

12. The transmitter/receiver component according to claim 9, further comprising:
    a third controllable current source that is looped between a supply voltage and a gate terminal of the driver transistor; and
    a fourth controllable current source that is looped between the gate terminal of driver transistor and a reference potential, wherein the third controllable current source and the fourth controllable current source are controlled by the control unit to change the edge steepness of the output signals.

13. The transmitter/receiver component according to claim 9, wherein the delay unit is further configured in such a way that in the case of the increase in the edge steepness of the signals, the one or more of the rising signal edge and the falling signal edge is delayed by such a time period that for a receiver of the signals, the rising signal edge and/or falling signal edge can be received at an unchanged point in time.

14. The transmitter/receiver component according to claim 9, wherein the high frequency interference detector comprises a rectifier that rectifies high-frequency interference signals on the bus line.

15. The transmitter/receiver component according to claim 14, wherein the high frequency interference detector comprises a filter, which filters the rectified high-frequency interference signals.

16. The transmitter/receiver component according to claim 15, wherein the filter comprises an averager that forms an average from the rectified high-frequency interference signals.

17. The transmitter/receiver component according to claim 9, wherein the bus system is a LIN bus system, and wherein the transmitter/receiver component forms a LIN bus driver.

* * * * *